United States Patent [19]

Schliepe et al.

[11] 4,149,074
[45] Apr. 10, 1979

[54] DETECTOR FOR A SCANNING TRANSMISSION-TYPE ELECTRON MICROSCOPE

[75] Inventors: Reinhard Schliepe; Volker Rindfleisch; Karl-Heinz Muller; Hans-Martin Thieringer, all of Berlin, Fed. Rep. of Germany

[73] Assignee: Siemens Aktiengesellschaft, Munich, Fed. Rep. of Germany

[21] Appl. No.: 717,652

[22] Filed: Aug. 25, 1976

[30] Foreign Application Priority Data

Sep. 19, 1975 [DE] Fed. Rep. of Germany ....... 2542355

[51] Int. Cl.² ............................................ H01J 37/26
[52] U.S. Cl. ..................................... 250/311; 250/397
[58] Field of Search ............... 250/310, 311, 398, 397; 350/96 R, 96 C

[56] References Cited

U.S. PATENT DOCUMENTS

| | | | |
|---|---|---|---|
| 3,629,579 | 12/1971 | Naitou | 250/442 |
| 3,835,246 | 9/1974 | Muller et al. | 250/311 |
| 3,866,077 | 2/1975 | Baker et al. | 250/311 |
| 3,995,935 | 12/1976 | McCartney | 350/96 C |
| 4,011,005 | 3/1977 | Hawkes | 350/96 C |

FOREIGN PATENT DOCUMENTS 1017354 1/1966 United Kingdom ................. 350/96 C

OTHER PUBLICATIONS

"Scanning Transmission Electron Microscopy with Cambridge Stereoscan MKII", Swift et al., Jour. of Scientific Inst., 1969, Series 2, vol. 2, pp. 744-746.

*Primary Examiner*—Bruce C. Anderson
*Attorney, Agent, or Firm*—Kenyon & Kenyon, Reilly, Carr & Chapin

[57] ABSTRACT

A scanning transmission-type electron microscope including an annular-shaped detector disposed concentrically with respect to the optical axis of the microscope behind a specimen along the microscope beam path, and means for amplifying output signals generated by the detector. The detector comprises a scintillation detector and the microscope includes a photoelectron multiplier coupled to the detector and disposed outside the microscope beam. A curved light guide is also coupled to the detector and the photoelectron multiplier and includes a canal which extends through the light guide along the microscope axis for permitting the passage of a central ray cone of the electron beam of the microscope through the light guide.

2 Claims, 4 Drawing Figures

DETECTOR FOR A SCANNING TRANSMISSION-TYPE ELECTRON MICROSCOPE

BACKGROUND OF THE INVENTION

1. Field of the Invention

The present invention relates generally to scanning transmission-type electron microscopes, and in particular to an improved detector for such microscopes.

2. Description of the Prior Art

Scanning transmission-type electron microscopes which include at least one annular detector disposed concentrically with respect to the optical axis of the microscope behind the specimen along the microscope beam path and an amplifier for amplifying the output signals generated by the detector are generally known in the art and are utilized for dark field or phase contrast pictures. See Rose, "Phase Contrast In Scanning Transmission Electron Microscopy", 39 Optik 416–436 (1974).

SUMMARY OF THE INVENTION

It is an object of the present invention to provide an improved detector for a scanning transmission-type electron microscope of the foregoing type which is highly sensitive and in which the signal-to-noise ratio is large.

These and other objects are achieved by the invention in a scanning transmission-type electron microscope which includes an annular-shaped detector disposed concentrically with respect to the optical axis of the microscope behind a specimen along the microscope beam path, and means for amplifying output signals generated by the detector. The improvement of the invention comprises the detector comprising a scintillation detector and the microscope including a photoelectron multiplier coupled to the detector and disposed outside the microscope beam. A curved light guide is coupled to the detector and the photoelectron multiplier and includes a canal extending through the light guide along the microscope axis for permitting the passage of a central ray cone of the microscope beam through the light guide.

The combination of a scintillation detector and a photoelectron multiplier in a scanning transmission-type electron-microscope is known in the art. See A. V. Crewe ET AL, "A High Resolution Scanning Transmission Electron Microscope", 39 Journal of Applied Physics, pp. 5861 ff. (1968). In such combinations, the photoelectron multiplier is coupled to the scintillator by a short, annular-shaped light guide. Scintillation detectors have nearly ideal properties if the average number of electrons released in the photocathode of the photomultiplier is much greater than one (1) for each incident electron. At the present state of the art, an average energy of about 3.3 KeV of incident electrons is required, using modern organic scintillators, to release one photoelectron if the transfer factor for the light signal from the scintillator to the photocathode is optimum. Thus, scintillation detectors are almost ideal detectors for electrons having an energy greater than 40 KeV and barely contribute to noise signals. The present invention permits these properties of scintillation detectors and annular-shaped detectors to be exploited.

The light guide of the detector of the invention may be fabricated of solid light-transmitting material such as glass, and is preferably formed in the shape of a bent glass rod having a bore forming the canal therein. In such an embodiment, the light guide preferably includes a curved, convex reflection surface shaped in the form of either an ellipsoid or a paraboloid, the focal point of which is disposed in an entrance plane of the light guide. Such an arrangement minimizes the number of reflections in the light guide, since a light ray emanating from the detector is reflected at most once in the curved part of the light guide.

In another embodiment of the invention, the light guide may comprise a bundle of light-transmitting fibers which are disposed about and extend around the canal in the light guide. This assures that the light is transmitted in the same manner to the photoelectron multiplier from all elements of the entrance plane of the light guide.

These and other novel features and advantages of the invention will be described in greater detail in the following detailed description.

DETAILED DESCRIPTION

Figure 1:
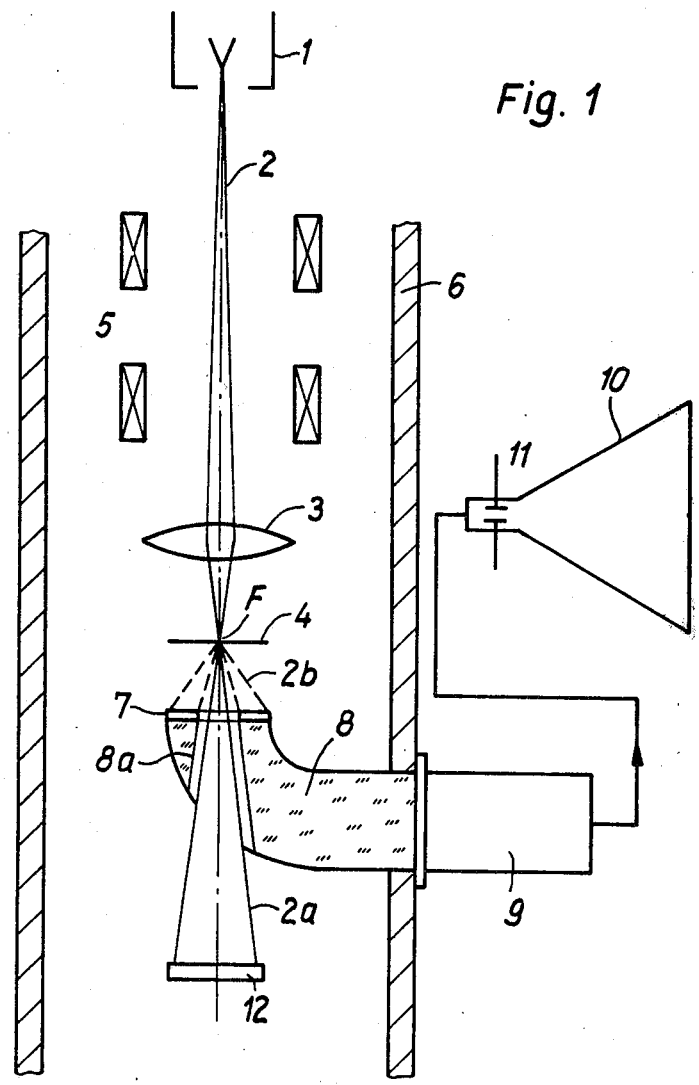
FIG. 1 is a schematic diagram of an improved detector for a scanning transmission-type electron microscope constructed according to the present invention.

Referring now to the drawings, and in particular to FIG. 1, there is shown a scanning transmission-type electron microscope including an electron beam source 1 which may comprise, for example, a field emission cathode. Electron beam 2 of the microscope is focused by means of an objective lens 3 on a specimen 4 at the focus point F and is deflected by a deflection system 5 so that the beam focused at point F on specimen 4 scans the beam in raster fashion along a plurality of parallel lines. The microscope is disposed within a housing, the walls of which are schematically illustrated and are identified by the reference numeral 6.

Electron beam 2 of the microscope generates a cone of primary rays 2a and a cone of scatter rays 2b after the beam passes through specimen 4. A scintillation detector 7 is disposed behind the specimen along the beam path to register the intensity of the beam in the scatter ray cone 2b, for example, for dark field pictures. A light guide 8 is coupled to the scintillation detector and extends through the housing 6 of the microscope in a vacuum-tight seal. The light guide is coupled to a photoelectron multiplier 9 disposed outside the microscope housing walls 6. The output signals generated by photoelectron multiplier 9 are transmitted to a picture tube monitor 10, for example, a cathode ray tube, and control the brightness of the monitor. Monitor 10 includes a deflection system 11 which is operated synchronously with deflection system 5 of the microscope.

Light guide 8 is provided with a canal 8a extending therethrough along the microscope axis for permitting the passage of the primary ray cone 2a of electron beam 2 through the light guide. In the illustrated embodiment of the invention, the canal is shaped in the form of a hollow cone. An additional detector 12 is provided along the microscope axis below canal 8a for registering the intensity in the primary ray cone 2a. Detector 12 may be of any desired design.

Figure 2:
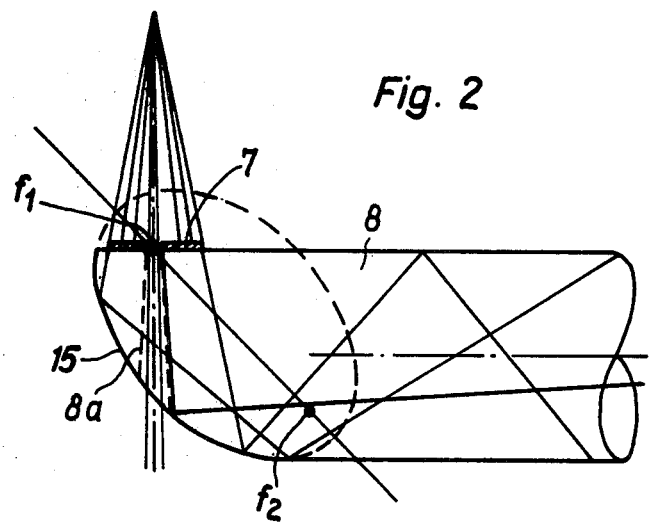
FIG. 2 is a schematic diagram of one embodiment of a light guide for use in a scanning transmission-type microscope constructed according to the present invention.

Light guide 8 has a curved shape and may be fabricated of a light-transmitting material. For example, the light guide may comprise a bent glass rod and the canal a bore hole through the rod, as illustrated in FIG. 2 of the drawings. In this embodiment of the invention, the light guide includes a curved reflection surface 15 which comprises part of an elongated rotation ellipsoid, the focal plane fl of which lies in the entrance plane of the light guide. Thus, the light rays emanating from scintillator 7 are reflected only once within the light guide.

Figure 3:
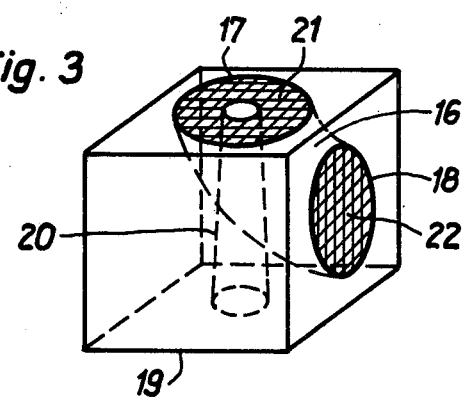
FIG. 3 is a schematic illustration of another embodiment of a light guide for use in a scanning transmission-type microscope constructed according to the present invention.

As illustrated in FIG. 3, light guide 8 may also comprise a bundle of light-transmitting fibers 16 which are tied together in a bunch by snap rings 17 and 18 and are disposed within a box mold 19 having the required curvature. Box mold 19 contains a conical tube 20 which penetrates the fiber bundle 16. After the fiber bundle is placed in the box mold, mold 19 is filled with a casting, material, such as, for example, casting resin, and after the latter material has set, an entrance surface 21 and an exit surface 22 are ground flat. Box mold 19 and conical tube 20 are preferably fabricated of metal and may remain joined to the finished casting.

The individual fibers of the bundle 16 may be arranged in a coordinated manner so that the intensity distribution at entrance surface 21 of the light guide is imaged unchanged on the exit surface 22 of the light guide. In such an arrangement, the radial intensity distribution of the scatter ray cone 2b may be measured, for example, by arranging concentric masks between the exit surface 22 and the photoelectron multiplier 9. It may, however, also be sufficient to arrange the individual fibers of bundle 16 in random fashion so that only the intensity integral of scatter ray cone 2b can be measured.

Figure 4:
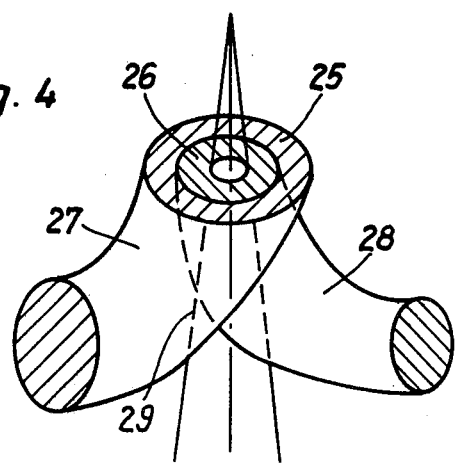
FIG. 4 is a schematic illustration of still another embodiment of a light guide for use in a scanning transmission-type microscope constructed according to the present invention.

As shown in FIG. 4, several concentric beam detectors may be arranged in one plane. In such an arrangement, a light guide fiber bundle 27 is coupled to annular scintillation detector 25 and another light guide fiber bundle 28 is coupled to another annular scintillation detector 26. The fibers of each of the bundles are partially intertwined and both bundles have a conical canal 29 for permitting the passage of the primary ray cone of the electron beam therethrough.

In the foregoing, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a scanning transmission-type electron microscope including an annular-shaped first detector disposed concentrically with respect to the optical axis of the microscope behind a specimen along the microscope beam path, a second detector provided along said axis below said first detector for registering the intensity of a central ray cone of the beam of said microscope to obtain a bright-field image, and means for amplifying output signals generated by the first detector, the improvement comprising said first detector comprising a scintillation detector for detecting the dark-field image generated by a scatter-ray cone of the electron beam of the microscope, and said microscope including a photoelectron multiplier, coupled to said first detector and disposed outside the microscope beam, and a curved light guide, coupled to said first detector and said photoelectron multiplier, said light guide comprising a bundle of light-transmitting fibers and including a canal extending through said light guide along the microscope axis for permitting the passage of said central ray cone of said beam through said light guide to said second detector, said bundle of light-transmitting fibers being disposed about said canal.

2. The microscope recited in claim 1, wherein said bundle includes an entrance surface and an exit surface, and wherein said fibers of said bundle are arranged so that said entrance surface is imaged on said exit surface.

* * * * *